United States Patent [19]

Chan

[11] Patent Number: 4,462,051
[45] Date of Patent: Jul. 24, 1984

[54] DEMODULATOR FOR AN ASYNCHRONOUS BINARY SIGNAL

[75] Inventor: Steven S. Chan, Fremont, Calif.

[73] Assignee: Ampex Corporation, Redwood City, Calif.

[21] Appl. No.: 365,085

[22] Filed: Apr. 2, 1982

[51] Int. Cl.³ ............................................. G11B 5/09
[52] U.S. Cl. ......................................... 360/44; 360/43
[58] Field of Search ........................ 360/39, 43, 44, 51

[56] References Cited

U.S. PATENT DOCUMENTS

| | | | |
|---|---|---|---|
| 3,959,816 | 5/1976 | Spiecers | 360/44 |
| 4,032,915 | 6/1977 | Shanks et al. | 360/44 |
| 4,060,837 | 11/1977 | Rynearson | 360/44 |
| 4,173,026 | 10/1979 | Deming | 360/44 |

*Primary Examiner*—Vincent P. Canney
*Attorney, Agent, or Firm*—Burns, Doane, Swecker & Mathis

[57] ABSTRACT

To decode a binary signal without regard to the speed at which it is read, each transition in the binary signal is detected, and the time lapse between successive transitions is determined to thereby establish the length of a pulse in the binary signal. The length of one pulse is compared with that of the immediately preceding bit cell to determine whether their lengths are approximately the same or vary by a factor of approximately 2. If the two compared lengths are approximately the same, it is recognized that there is no change in the information conveyed by the signal and therefore the binary state of the most recently detected pulse is representative of the previously established binary state of the signal. However, if the pulse has a duration of approximately one half that of the preceding bit cell, a change in the state of the binary information being conveyed is recognized, and an appropriate indication is provided to signal such change. A multiplexing technique is employed to simultaneously decode a number of signals in this manner.

32 Claims, 9 Drawing Figures

DEMODULATOR FOR AN ASYNCHRONOUS BINARY SIGNAL

CROSS-REFERENCE TO RELATED APPLICATION

Reference is made to copending application Ser. No. 364,923 entitled "Ratio Comparator For Digital Signals", which discloses some subject matter that is common to the present disclosure. The subject matter disclosed in that application is incorporated herein by references thereto.

BACKGROUND OF THE INVENTION

The present invention relates to the decoding or demodulating of binary signals, and in particular signals that convey the binary information by means of frequency modulation, for example by encoding in a Manchester type format. More specifically, the present invention relates to the decoding of two or more binary signals that can be read at different and varying speeds, for example time codes that are read from two or more variable velocity tape recorders.

In the recording of information on magnetic tape, it is often necessary, and desirable, to record separate pieces of information on separate tapes that are subsequently played back together to reproduce the recorded information. For example, in the recording of a live performance, the visual information might be recorded by means of a videotape recorder while the accompanying audio information is recorded with an audio tape recorder. During playback, it is necessary to insure that the two tapes on which the information is recorded are in synchronism, to accurately reproduce the information as recorded. In order to effect such synchronism, a time code is typically recorded on each tape along with the visual or audio information of interest. The time code basically indicates the portion of the tape that is being presented to the magnetic writing and reading heads of the recorder.

The time code information generally comprises a binary signal that is recorded on the magnetic tapes. One type of binary coding format that has been found to be quite suitable for use in this context is a format that is effectively a frequency modulation technique known as Manchester coding. In formats within this family of codes, the binary signal comprises a series of bit cells, each of which contains one bit of binary information. Each bit cell in the signal is distinguished from the immediately preceding bit cell by a transition in the signal, i.e. a switching from one voltage level to another. The binary information itself is conveyed by means of the presence or absence of a transition within each bit cell. For example, a transition occurring approximately near the middle of a bit cell can be indicative of the true, or binary one state, and the absence of a transition can be indicative of the other binary state, i.e. false or binary zero.

Other codes within this same general format may convey the binary information by means of the placement of the transition within the bit cell, e.g. within the first one-third of the bit cell to convey one binary state and within the last one-third to indicate the other state. Still other codes utilize selective suppression of transitions within the signal to increase storage density. Examples of this latter type of code, known as the Miller code, and derivatives thereof are disclosed in U.S. Pat. Nos. 3,108,261; 4,027,335 and 4,234,897.

The advantages of using this type of coding format for the time code on magnetic recording tape lie in the fact that it is a self-clocking signal and that the D.C. content of the signal is not relied upon to convey the binary state information. More particularly, since each bit cell within the signal is distinguished from the others by means of a transition in the signal, there is no need to provide a separate clocking signal that indicates when each piece of binary information is being presented. Furthermore, since it is only necessary to determine whether or where a transition occurs within a bit cell to derive the binary state information from the signal, the D.C. content of the signal, i.e. the absolute voltage level of the signal, is not a critical factor. This latter consideration becomes particularly significant in magnetic tape recording environments, since the characteristics of magnetic tape are such that the actual voltage level of a signal may be frequency dependent, and hence subject to change as the transition rate varies. Even a reversal of the polarity of the signal does not affect the demodulation process with this type of signal.

Generally, it is a relatively simple task to read a time code that is indicated by a binary signal in this type of code format, to thereby determine the position of the tape. However, reading can present a difficult problem when the tape undergoes changes in speed, which can occur quite frequently when one tape is being run at a speed dependent on the position of another. More particularly, the problem in reading this format is occasioned by the fact that the length, i.e. time duration, of each bit cell varies as the speed of the tape is varied, and the signal is essentially asynchronous. For example, when the tape is running at one particular speed, each bit cell might have a duration of one millisecond. Therefore, to determine the binary information contained in the signal it is only necessary to determine whether or where transitions occur in the signal within less than one millisecond of each other. However, if the tape is then slowed down to one half its previous speed, each bit cell will have a duration of two milliseconds and therefore a transition occurring within a bit cell might not be detected if one is looking for transitions that occur within less than one millisecond of each other. Conversely, if the tape speeds up to a point where each bit cell has a duration of ½ millisecond or less, then all transitions will occur within less than one millisecond of each other and the resulting information that is obtained will be erroneous.

Accordingly, in order to successfully detect a binary time code that is encoded in a frequency modulation type format, it is necessary to be able to establish the length of a bit cell within the binary signal, and to be able to adjust the length of the established bit cell in accordance with variations in speed of the magnetic tape to thereby properly detect transitions occurring within bit cells.

One type of demodulator for decoding a Manchester format time code recorded on a variable speed magnetic tape is disclosed in U.S. Pat. No. 4,040,100. The operation of that demodulator is based upon the comparison of the intervals between successive transitions in the time code signal to determine one of three states related to the information in the signal. The principle of operation of this system provides a reliable method for decoding a time code signal, and it is desirable to improve upon the concepts disclosed in that patent. More particularly, while the system disclosed in the patent is successful, it is not without attendant limitations. Foremost among these limitations is the fact that a relatively high number of integrated circuit chips are required to produce a practical implementation of the system. This requirement is due to the high number of logic functions performed by the circuit. In addition, a separate demodulator is required to decode each different time code signal, i.e. there is a one-to-one relationship between demodulators and recorders, because of relatively slow processing times.

Furthermore, the comparison of successive time intervals in the manner disclosed in the patent can result in decoding errors when certain types of noise or disturbances affect the time code signal. For example, a skewing of the tape on which the time code is recorded can result in a transition being detected relatively near the end of a bit cell, rather than near its middle. In such a case, one pulse in the bit cell will appear to be twice as long as the other pulse, and could result in an erroneous indication since they should be detected as pulses of approximately the same length.

OBJECTS AND A BRIEF SUMMARY OF THE INVENTION

It is therefore a general object of the present invention to be able to correctly decode a binary signal that can be read asynchronously. More specifically along these lines, it is the object of the present invention to provide a novel system for accurately decoding a binary signal that is capable of being read at varying speeds.

It is another object of the present invention to provide a novel method and apparatus for establishing the length of a bit cell within a binary signal and to be able to detect transitions occurring within bit cells.

It is yet another object of the present invention to provide a novel system for decoding an asynchronous binary signal that is capable of establishing the length of a bit cell and thereafter adjusting to changes in the length of the bit cell.

It is a further object of the present invention to provide a novel system for simultaneously decoding the time code signals recorded on two or more magnetic storage tapes through the use of a multiplexing technique.

It is still a further object of the present invention to provide a novel system that is capable of carrying out the foregoing objects with a minimal requirement for integrated circuit hardware.

It is yet another object of the present invention to provide a novel technique for decoding a binary signal that uses digital integration to reduce errors due to noise that affects detection of the location of transitions.

The present invention achieves these, as well as other objects and advantages, by providing a novel method and system for carrying out the method, in which each transition in a binary signal is detected, and the time lapse between successive transitions is determined to thereby establish the length of each pulse in the binary signal and the length of a preceding bit cell. The length of one pulse is compared with that of the immediately preceding bit cell to determine their ratio. If the ratio of the two compared lengths is within a first range, one binary state is recognized. However, if the ratio of their lengths falls within a second range, the other binary state is recognized, and an appropriate indication is provided of the detected state.

When a plurality of time code signals are to be decoded, a determination of the lengths of the most recent pulse and the preceding bit cell is separately made for each signal. When a transition is detected in one of the signals, it enables the two determined lengths for that signal to be presented to a comparator. The comparator receives the length determinations for all the time code signals separately by means of a multiplexing technique.

A fuller appreciation of the manner in which the present invention achieves the foregoing objects and their attendant advantages can be obtained from a perusal of the following detailed description of a preferred embodiment of the invention illustrated in the accompanying drawings.

DETAILED DESCRIPTION

Figure 1:
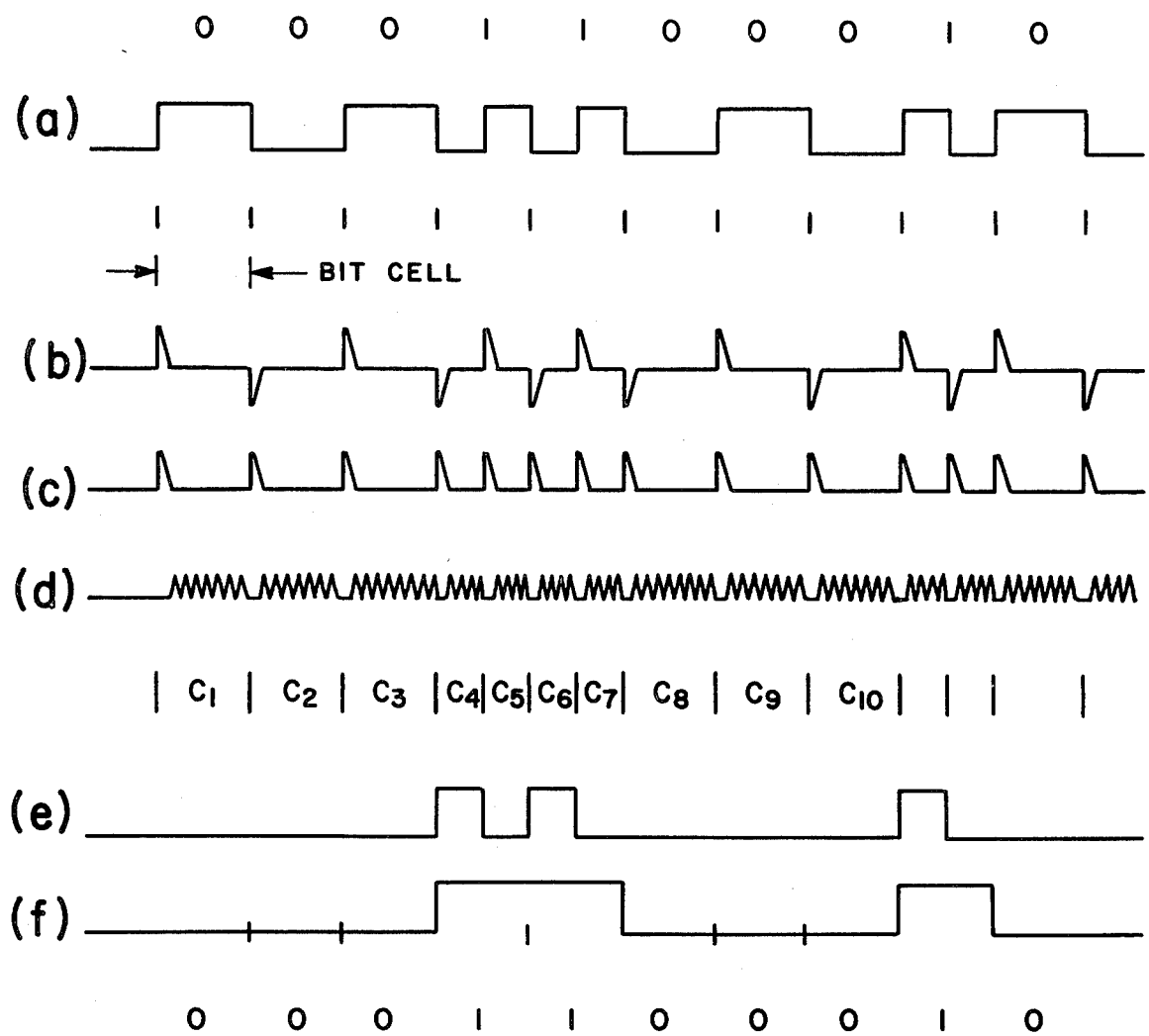
FIG. 1, consisting of (a)–(f), is a timing diagram illustrating a binary signal encoded in one particular Manchester format and the principles of the present invention that are used to detect the binary information contained within the signal.

In the following detailed description of the preferred embodiment of the present invention, reference is made thereto in the context of decoding two time code signals recorded on magnetic storage tapes, to facilitate an understanding of the application of the invention. To further facilitate an understanding of the invention, the operation of the illustrated embodiment is described with regard to the decoding of one particular type of binary signal. It will be appreciated, however, that the application of the invention is not so limited, and that it can be practically utilized in a variety of environments requiring the decoding of one or more synchronous or asynchronous binary signals.

A binary signal that is encoded in one type of code format within the Manchester family of codes is illustrated in FIG. 1a. The signal comprises a series of bit cells that are distinguished from one another by transitions in the amplitude of the signal. The various bit cells are denoted in FIG. 1a by the hash marks appearing below the binary signal. It will be observed that the amplitude of the signal is constant within each of the first three bit cells, but that the signal undergoes transitions within the next two bit cells. One bit of binary information is contained within each bit cell, and the binary state of that bit is indicated by the presence or absence of a transition within the bit cell. Thus, in the example illustrated in FIG. 1a, the first three bit cells in the binary signal represent binary zero states, and the next two bit cells each indicate the binary one state. This particular type of Manchester code is known as biphase mark modulated.

A binary signal encoded in this format is relatively simple to decode when read in a synchronous fashion. Basically, all that is required is a measurement of the time lapse between the first two detected transitions in the signal, to establish the length of the bit cell. Once this value is determined, it is then only necessary to look for transitions occuring within each bit cell. If a pulse indicative of the binary one state is the first pulse to be detected, then the length of the bit cell could be erroneously established at half of the actual length of a bit cell. However, this situation will be quickly detected, since no transitions will occur in less than this amount of time, and therefore the signal will appear to consist of only binary zeros. Once this fact is recognized the bit cell length determination is repeated until the proper bit cell length is established. After this is done, the decoding of the signal can continue relatively error free.

However, when the binary signal is being read asynchronously, rather than synchronously, for example due to variations in magnetic tape speed, all bit cells in the signal are not of the same length. Thus it will be appreciated that the foregoing method for decoding the binary signal will not operate satisfactorily.

In accordance with the present invention, a fixed bit cell length value is not employed to determine the binary information contained within each bit cell of the signal. Rather, the length of each pulse in the signal is compared with that of the preceding bit cell to determine whether there is a significant difference in their lengths. As used in the context of this disclosure, the term "significant difference" or "significant change" is intended to refer to the condition wherein the ratio of the length of the pulse relative to the bit cell is closer to a value of one half than it is to unity. In the preferred embodiment of the invention, a determination is made whether the ratio of the length of the pulse relative to that of the bit cell lies above or below the threshold value of 0.7. If below, a significant change is determined to have taken place.

To determine the relative lengths of two adjacent pulses in the binary signal, each transition in the signal is detected and the time lapse between successive transitions is measured. This function can be accomplished, for example, by differentiating the binary signal to produce a signal such as that illustrated in FIG. 1b. This signal is then rectified to produce a signal of the type shown in FIG. 1c, which comprises a series of impulses indicating each transition in the binary signal. The time lapse between adjacent impulses is counted with a high frequency clock signal. For example, the rectified signal of FIG. 1c can be used to reset and start a counter that counts the number of pulses in the high frequency signal. This situation is represented by the signal of FIG. of 1d, wherein the number of pulses appearing in each pulse burst is representative of the length of a pulse in the binary signal. The number of pulses appearing in each pulse burst is denoted in FIG. 1 by the reference terms $C_1, C_2, C_3 \ldots$. The number of pulses appearing in the most recently generated pulse burst is compared with a count related to the previous bit cell to determine whether a significant change has occurred in the binary signal.

Table 1 below provides an example of the counts that might be obtained from the binary signal of FIG. 1a when it is read in a synchronous fashion, e.g. the magnetic tape on which the signal is recorded is running at a constant speed so that each bit cell has the same length:

TABLE 1

| | $C_1$ | $C_2$ | $C_3$ | $C_4$ | $C_5$ | $C_6$ | $C_7$ | $C_8$ | $C_9$ | $C_{10}$ |
|---|---|---|---|---|---|---|---|---|---|---|
| Count | 100 | 102 | 101 | 50 | 48 | 51 | 49 | 99 | 101 | 100 |
| Change | — | 0 | 0 | 1 | — | 1 | — | 0 | 0 | 0 |

It can be seen that the first three counts obtained from the binary signal are each approximately equal, with a difference of one or two pulses being insignificant over a total count of approximately 100 pulses. However, $C_4$ is only approximately half the value of $C_3$. Therefore, it is recognized that a significant change in the length of a pulse relative to the preceding bit cell has occurred. In this case the length of the preceding bit cell is established by the length of the preceding pulse in the signal, i.e. $C_3$. The significant change is indicated by the first positive going pulse in the signal illustrated in FIG. 1e.

It will be appreciated that the count appearing after a significant change has been detected, for example, $C_5$, is not indicative of a new bit of binary information. Rather, it relates to the remainder of the bit cell in which the pulse appeared that signified the significant change. Therefore, the length of a pulse that is determined immediately following the detection of a significant change is not compared with that of the immediately preceding pulse, but rather is added thereto to establish the length of the bit cell for comparison with the next detected pulse.

The indication of significant changes occurring in the information contained within the binary signal can be used to provide a suitable signal related to this binary information. For example, it can be used to produce a binary signal of the type illustrated in FIG. 1f, wherein the binary zero state is indicated by a low D.C. level and the binary one state as indicated by a high D.C. level.

The foregoing method enables the binary information contained within a signal encoded in a frequency modulation type format to be accurately determined regardless of the speed at which the binary signal is presented to a receiving device. For example, Table 2 indicates the counts that might be obtained by the signal of FIG. 1a when it is read at a speed that is faster than that represented by the example indicated in Table 1:

TABLE 2

| | $C_1$ | $C_2$ | $C_3$ | $C_4$ | $C_5$ | $C_6$ | $C_7$ | $C_8$ | $C_9$ | $C_{10}$ |
|---|---|---|---|---|---|---|---|---|---|---|
| Count | 70 | 71 | 70 | 33 | 35 | 32 | 34 | 69 | 71 | 71 |
| Change | — | 0 | 0 | 1 | — | 1 | — | 0 | 0 | 0 |

As can be seen from Table 2, the count obtained with each pulse is proportionately less due to the shortened length of that pulse. However, the ratio of the length of each pulse to that of the preceding bit cell remains the same, so that is possible to determine whether a significant change has occurred.

Similarily, in the case in which the rate at which the binary signal is being read increases or decreases, for example due to acceleration or deceleration of the magnetic tape on which the signal is recorded, the binary information contained within the signal can be obtained through the foregoing method. Such a condition is exemplified by the results depicted in Table 3, which relate to the situation in which the tape is accelerating at a very rapid rate so that the length of each subsequent bit cell gets progressively shorter.

TABLE 3

|  | $C_1$ | $C_2$ | $C_3$ | $C_4$ | $C_5$ | $C_6$ | $C_7$ | $C_8$ | $C_9$ | $C_{10}$ | $C_{11}$ | $C_{12}$ | $C_{13}$ |
|---|---|---|---|---|---|---|---|---|---|---|---|---|---|
| COUNT | 200 | 180 | 160 | 70 | 60 | 50 | 40 | 75 | 70 | 65 | 30 | 27 | 50 |
| CHANGE | — | 0 | 0 | 1 | — | 1 | — | 0 | 0 | 0 | 1 | — | 0 |

In the results illustrated in Table 3, it will be noted that the count C4, representative of the length of a short pulse corresponding to a transition within a bit cell, is approximately the same as counts C8, C9 and C10, which relate to the full lengths of bit cells. However, by comparing each count only with that of the immediately preceding bit cell count, errors occasioned by changes in the length of a bit cell are negated. In other words, rather than looking at the absolute value of the count for each pulse, the value of each pulse count relative to that of the preceding bit cell count is the determinative factor in detecting transitions within a bit cell.

Figure 2A:
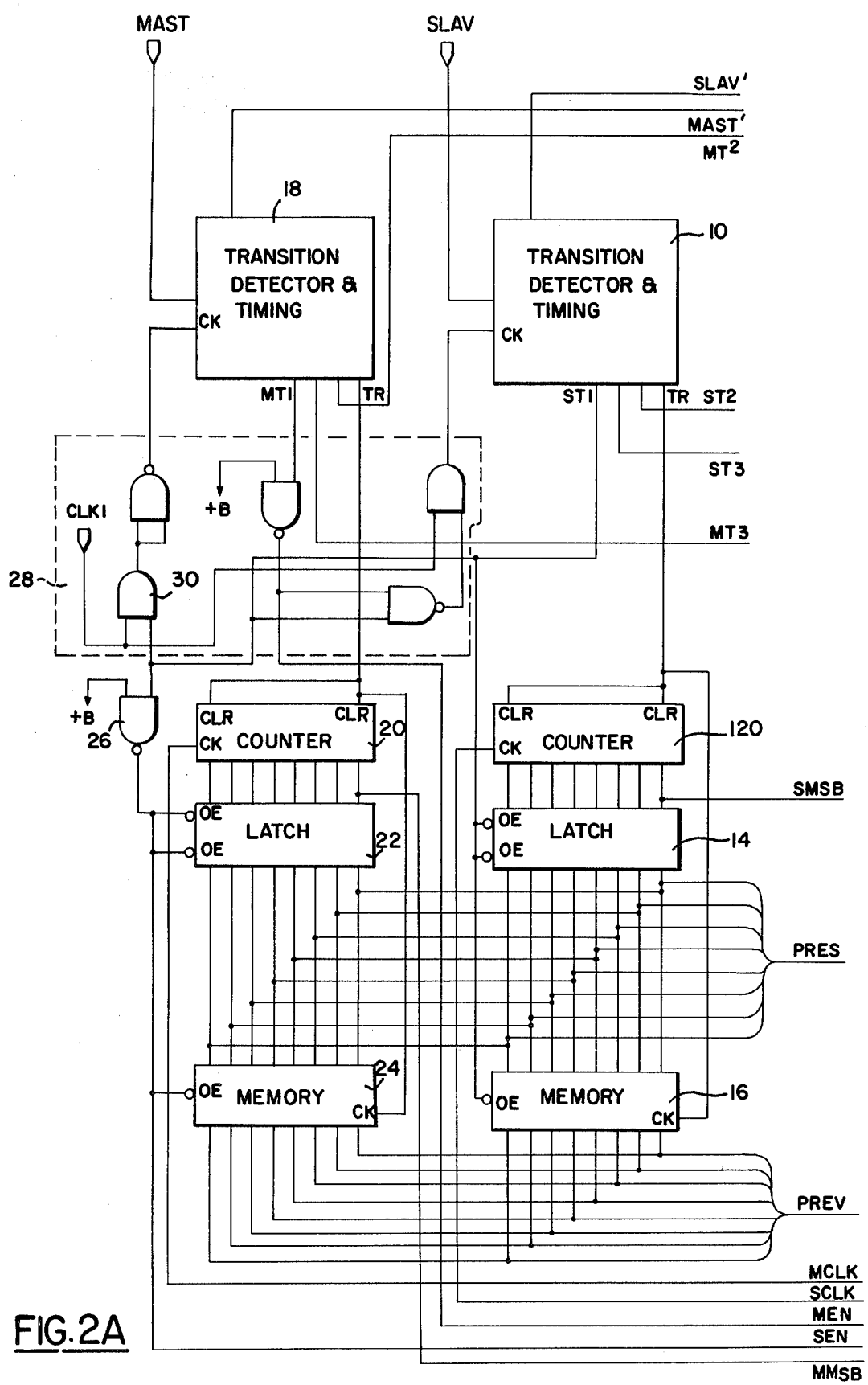
FIGS. 2a and 2b, taken together, are a block circuit diagram of a demodulator circuit for decoding information contained in two different binary time code signals.
Figure 2B:
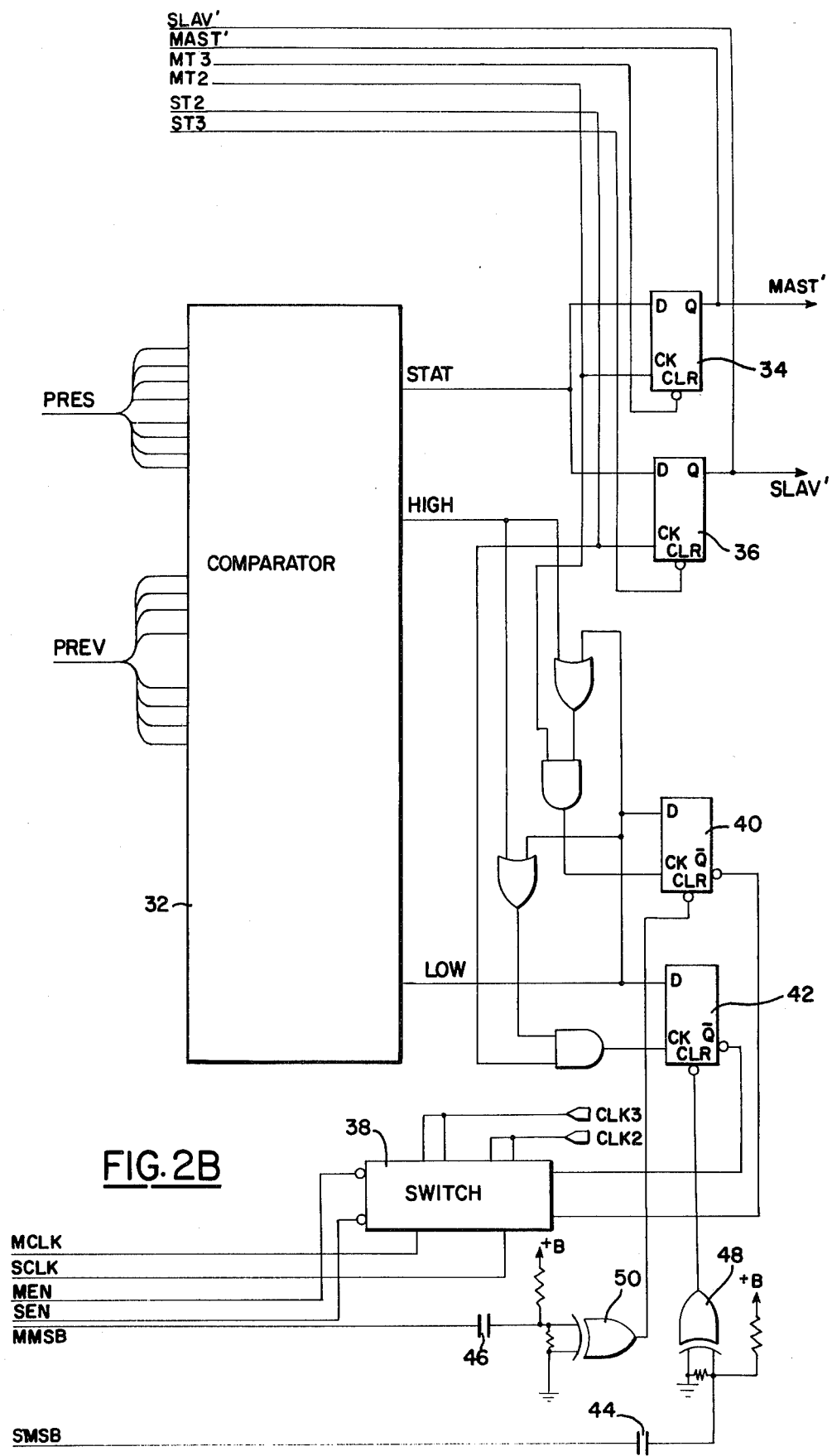

A demodulator circuit for implementing the foregoing method in accordance with the present invention is illustrated in block diagram form in FIGS. 2a and 2b. The particular circuit illustrated in these figures is designed to decode two frequency modulated binary signals MAST and SLAV. For example, these two signals might be the time code signals from a master tape recorder and a secondary tape recorder whose speed is to be synchronized, or slaved, to that of the master tape recorder. The binary information contained in each of the two time code signals is obtained therefrom and separately supplied to a suitable transport control mechanism (not shown) that adjusts the speed of the slaved tape recorder in accordance with the time code signal obtained from the master tape recorder to insure that they run in synchronism.

Referring to FIG. 2a, the time code signal SLAV is provided as an input signal to a transition detector and timing circuit 10. This circuit produces an output signal TR that indicates when a transition in the time code signal occurs. For example, this output signal can be in the form of the signal illustrated in FIG. 1c. The transition signal TR is applied as a reset signal to a counter 12. A clock signal SCLK (referenced in the lower right hand portion of FIG. 2A) is applied to the input terminal of the counter, which counts the number of pulses in the clock signal occurring between successive transition signals to produce counts of the type depicted in FIG. 1d.

At the end of each counting period, the count is transferred into a latch circuit 14 before the counter 12 is cleared by a transition signal from the detector and timing circuit 10. The transition output signal TR from the detector and timing circuit 10 also provides a clock input signal to a memory unit 16. The memory unit receives the count that was previously stored in the latch circuit 14. Thus, the latch circuit 14 contains a count indicative of the length of the most recently measured pulse in the SLAV input signal, and the memory circuit 16 contains a count relating to the length of the previous one or two pulses in the input signal. These two counts are presented as output signals PRES and PREV, respectively, upon the production of a timing signal ST1 from the detector and timing circuit 10 that is applied to the output enable terminals of the latch circuit 14 and the memory unit 16.

In a similar fashion, the master time code signal MAST is presented to a transition detector and timing circuit 18 that controls a counter 20, a latch circuit 22 and a memory unit 24 to provide output signals indicative of the length of the present pulse and the previous bit cell in the master time code signal. In the embodiment illustrated in FIG. 2a, the timing signal ST1 from the transition detector and timing circuit 10 for the SLAV signal also controls the output of information from the latch circuit 22 and the memory unit 24 for the MAST signal. More specifically, the ST1 timing signal is provided to one input terminal of a NAND gate 26 whose other input terminal is biased to a high potential. The output terminal of the NAND gate 26 is connected to the enable input terminals of the latch circuit 22 and the memory unit 24. In the arrangement illustrated in FIG. 2a, the latch circuit 22 and memory unit 24 for the MAST signal are normally enabled to provide output signals, except when the ST1 timing signal from the SLAV timing circuit 10 goes low, in which case these two circuits are disabled and the latch circuit 14 and memory unit 16 for the SLAV signal are enabled to provide output signals. In this fashion, the output signals representative of the lengths of the present pulse and the previous bit cell in both the MAST and SLAV time code signals are multiplexed on common PRES and PREV output lines.

In the event that a transition occurs in each of the MAST and SLAV signals at precisely the same time, an arbitrator circuit 28 is provided to selectively enable only one of the pulse length determining circuits to provide an output signal. In the arrangement illustrated in FIG. 2a, the arbitrator 28 comprises a logic circuit that gives priority to the pulse length determining circuits for the SLAV signal when a transition occurs in both the SLAV and MAST signals at the same time. In operation, if both of the transition detector and timing circuits 10 and 18 produce ST1 and MT1 timing signals simultaneously, the latch and memory circuits 22 and 24 will be disabled through the operation of the NAND gate 26. In addition, the ST1 timing signal from the SLAV transition detector and timing circuit 10 disables a NAND gate 30 within the arbitrator circuit 28 to thereby interrupt the presentation of a clock signal CLK1 to the detector and timing circuit 18 for the MAST signal. Thus, the status of this circuit is held while the ST1 timing signal from the SLAV timing circuit 10 remains low. The presentation of a clock signal to the MAST timing circuit 18 is continued as soon as the ST1 timing signal from the SLAV detector and timing circuit 10 goes high, so that processing of the MAST signal can resume. Interruption in the operation of one of the pulse length determining circuits may result in the loss of one or two counts relating to the next succeeding pulse in that signal. However, as illustrated previously in the tables exemplifying various counts for a signal, the loss of a relatively few number of counts is insignificant as long as the frequency of the clock signal that is applied to the counters 12 and 20 is sufficiently high.

The arbitrator circuit 28 also temporarily interrupts the presentation of clock pulses to the detector and timing circuit 10 for the SLAV signal whenever the detector and timing circuit 18 for the MAST signal produces a MT1 timing pulse. Thus, if a transition occurs in the SLAV signal while the length of a pulse in the MAST signal is being determined, this piece of information will not be lost and the processing of the SLAV signal can resume as soon as the MAST pulse length determining circuit resumes operation to detect the length of the next pulse in that signal.

The PRES and PREV output signals from the pulse length determining circuits are provided as input signals to a comparator 32 that operates in the manner described previously to compare the information in the PRES input signal, representative of the length of one pulse, with that of the PREV signal, representative of the length of the previous bit cell, and to provide an output signal that indicates whether a significant difference in the two compared lengths is present. Alternatively, the comparator can provide an output signal that directly indicates whether a binary one or binary zero has been detected, rather than merely indicate whether a significant change has occurred. The circuit illustrated in FIG. 2b is designed for this latter situation.

In the described embodiment of the present invention, the comparator 32 determines whether the ratio of the present and previous counts exceeds the value of 0.7. Ideally, the ratio of the two counts is either approximately 0.5 or 1.0 for a signal of the type illustrated in FIG. 1a. However, transitions do not always occur precisely in the center of a bit cell, due to practical limitations of magnetic tape and transition detection circuitry. For example, the relative lengths of the two short pulses that comprise a binary one bit cell can be in the ratio of 3:7. Based upon empirical determinations, it has been found that the use of the value 0.7 as the threshold value provides the most reliable results in this situation.

The output signal STAT from the comparator 32 that is indicative of the binary state of either of the MAST or SLAV signals is provided to the D input terminal of two D flip-flops 34 and 36. The two flip-flops are clocked and cleared by appropriate timing signals from the detector and timing circuits 10 and 18, respectively. For example, the flip-flop 34 receives a clock signal MT2 from the MAST detector and timing circuit 18 that enables it to read the STAT output signal from the comparator 32 and provide an output signal MAST' indicative of the detected binary state of the MAST signal. Thereafter, the flip-flop 34 is cleared by another timing signal MT3 from the MAST detector and timing circuit 18. In a similar fashion the flip-flop 36 is controlled by timing signals ST2 and ST3 from the SLAV detector and timing circuit 10 to provide an output signal SLAV' indicative of the binary state of the SLAV time code signal. In this fashion, the STAT output signal from the comparator is demultiplexed to provide two separate information output signals. These signals can be supplied to an appropriate transport control circuit to control the speed of the slaved tape recorder relative to the time code from the master tape recorder.

In addition to providing an output signal indicative of the binary state of the measured input signal, the comparator also preferably indicates when the counts indicated by the PRES and PREV signals are too high or too low. For example, if the number of counts in the input signals to the comparator 32 are relatively low, the comparator may not be provided with sufficient information to make an intelligent decision as to whether a significant difference is present in the two counts. For example, in the extreme case where one of the input signals is a binary 3 and the other is a binary 2, the ratio of the two counts is less than 0.7, and therefore the comparator would indicate a change in state of the binary signal. However, it will be observed that the actual difference in the two input signals is only one clock pulse and it may be possible that two pulses in the binary signal are of the same length, but their transitions were positioned relative to the clock pulses so that only two clock pulses were measured during one pulse and three were measured during the next pulse. In such a situation, it is preferable to increase the frequency of the clock signal that is applied to the counter of the pulse length determining circuit.

To accomplish this function, a switch 38 responsive to a binary input signal is provided with clock signals CLK2 and CLK3 at two different frequencies. For example, one of these clock signals might be at a frequency of 31.25 KHZ and the other can be at 500 KHZ. A LOW output signal is produced by the comparator 32 when the measured counts are too low, and is applied to the D input terminal of two D flip-flops 40 and 42. When the counts related to one of the time code signals, for example the SLAV signal, are indicated to be low, the flip-flop 42 is clocked by the ST2 timing signal from the SLAV detector and timing circuit 10 to receive the LOW input signal. The flip-flop 42 in turn provides a signal, e.g. a binary one, to the switch 38 indicating that a change from the low frequency clock to the high frequency clock is needed. In response to this signal, the switch 38 connects the higher frequency clock signal, for example CLK3, to an output terminal that provides the clock signal SCLK to the counter for the SLAV signal. In a similar fashion, the flip-flop 40 is operated in response to the MT2 timing signal from the MAST detector and timing circuit 18 to indicate when a change from a low frequency to a high frequency clock signal MCLK is required.

Similarly, it is desirable to switch from the high frequency to the low frequency signal whenever the counts presented to the comparator 32 reach the top end of a preferred range or window of counts. This top end of the range may be determined according to the capacity of the counters 12 and 20, so that as the binary input signals slow down and the lengths of the pulses increase, the contents of the counters will not be exceeded, causing them to overflow. In this situation, the comparator 32 provides an output signal HIGH indicating that a change from high frequency to low frequency counting pulses is required. This output signal also enables the flip-flops 40 and 42 to be clocked when the appropriate timing signal ST2 or MT2 from the detector and timing circuits 10 and 18 is provided. However, in this situation, the LOW output signal from the comparator 32 will be in a low state, thus resulting in a change in the state of the flip-flop, which is provided to the switch 38 to cause the appropriate frequency clock signal to be provided to the counter of the pulse length determining circuit.

In addition to being controlled by the HIGH and LOW output signals from the comparator 32, the flip-flops 40 and 42 can also be directly responsive to the output signals from the counters 12 and 20. For example, a signal related to the state of the most significant bit for each of the output signals of the SLAV counter 12 and the MAST counter 20 can be differentiated by means of in-line capacitors 44 and 46, respectively, and this signal applied to one input terminal of an EXCLUSIVE-OR gate 48, 50. The output terminals of these EXCLUSIVE-OR gates are connected to the clear, or reset, input terminals of the flip-flops 40 and 42. Thus, whenever the contents of one the counters reaches a state such that the most significant bit in the output signal from the counter goes high, a reset pulse will be applied to the associated flip-flop 40 or 42 to cause the flip-flop to be reset to a state that indicates that a low frequency clock signal is required.

As discussed previously with respect to the signals illustrated in FIG. 1, each bit cell indicative of the binary one state contains two pulses, which results in two counts, for example $C_4$ and $C_5$, being produced to indicate one bit of binary information. If each pulse were compared against the immediately preceding pulse, an erroneous indication of the binary information in the input signal could be provided. For example, if the count $C_5$ is compared against $C_4$, an indication of no change will be provided, which could be interpreted to mean that a second bit of binary information is being detected. However, in reality, these two counts taken together relate to only one bit of information.

In order to compensate for this situation, it is desirable to integrate the two counts representing a binary one bit. To carry out this function, the MAST' and SLAV' signals produced by the flip-flops 34 and 36 are fed back to the appropriate detector and timing circuits 10 and 18. These feedback signals function as inhibit, or disable, signals whenever the comparator indicates that the present pulse relates to a binary one. This inhibit signal prevents the transition signal TR from being presented to the counter and memory units of the pulse length determining circuit. For example, referring to the signals illustrated in FIG. 1, when the transition within the first bit cell that signifies the binary one state occurs, the ST1 timing signal from the detector and timing circuit 10 enables the latch circuit 12 to read the contents of the counter, i.e. $C_4$, at this point, and enables the latch circuit 12 and the memory unit 14 to provide output signals relating to the counts $C_4$ and $C_3$, respectively. These counts are compared in the comparator 32, which provides an indication that the binary one state has been detected. This indication is fed back to the transition detector and timing circuit 10 by means of the SLAV' signal, which inhibits the TR signal from being produced. Thus, instead of being reset, the counter 14 continues to count during the bit cell until the next transition is detected. At this point, the transition signal TR is produced to reset the counter, since the flip-flop 36 has been reset by means of the ST3 timing signal from the timing circuit 10. Consequently, at this point the contents of the counter is equal to the sum of the $C_4$ and $C_5$ counts. In other words, the counter provides an indication of the total length of the bit cell in which these two counts were produced. Thus, when the transition signal TR is generated, the information that is transferred from the latch circuit 14 to the memory unit 16 is the total length of the bit cell, rather than just the length of one pulse within the bit cell. Hence, the comparator 32 is able to compare the length of the most recently measured pulse against that of the previously measured bit cell.

The comparison of a pulse with the integrated length of the immediately preceding bit cell, rather than merely the preceding pulse, provides a reliable method for reducing errors caused by some types of noise. For example, skewing of the magnetic tape during recording or playback can cause a transition to be detected at a point other than near the center of a bit cell. The counts $C_3$–$C_7$ for the signal illustrated in FIG. 1d could be 100, 65, 35, 65, 35, respectively. When $C_4$ (65) is compared with $C_3$ (100), a binary one will be properly detected. Then, in the next bit cell, if $C_6$ (65) is compared only with the immediately preceding pulse count $C_5$ (35), a binary zero might improperly be indicated since $C_6$ is approximately double $C_5$. However, by comparing $C_6$ with the total length of the preceding bit cell, i.e. $C_4+C_5$, a binary one will properly be detected.

This integration technique is also particularly useful for reducing errors that might be occassioned by a time code signal that is not properly equalized during the recording or playback process.

The comparator 32 can be any suitable conventional comparator that is capable of comparing the PRES input signal against the PREV signal and providing an output signal that indicates the binary zero or binary one state in dependence upon whether the two compared input signals are approximately equal or in the ratio of 1:2, respectively. A preferred embodiment of such a comparator is illustrated in block diagram form in FIG. 3. This embodiment particularly relates to the situation in which the PRES and PREV input signals are each 8-bit binary signals that are provided to the comparator in parallel. However, it will be appreciated that the comparator is capable of operating upon input signals containing a lesser or greater number of bits.

Figure 3:
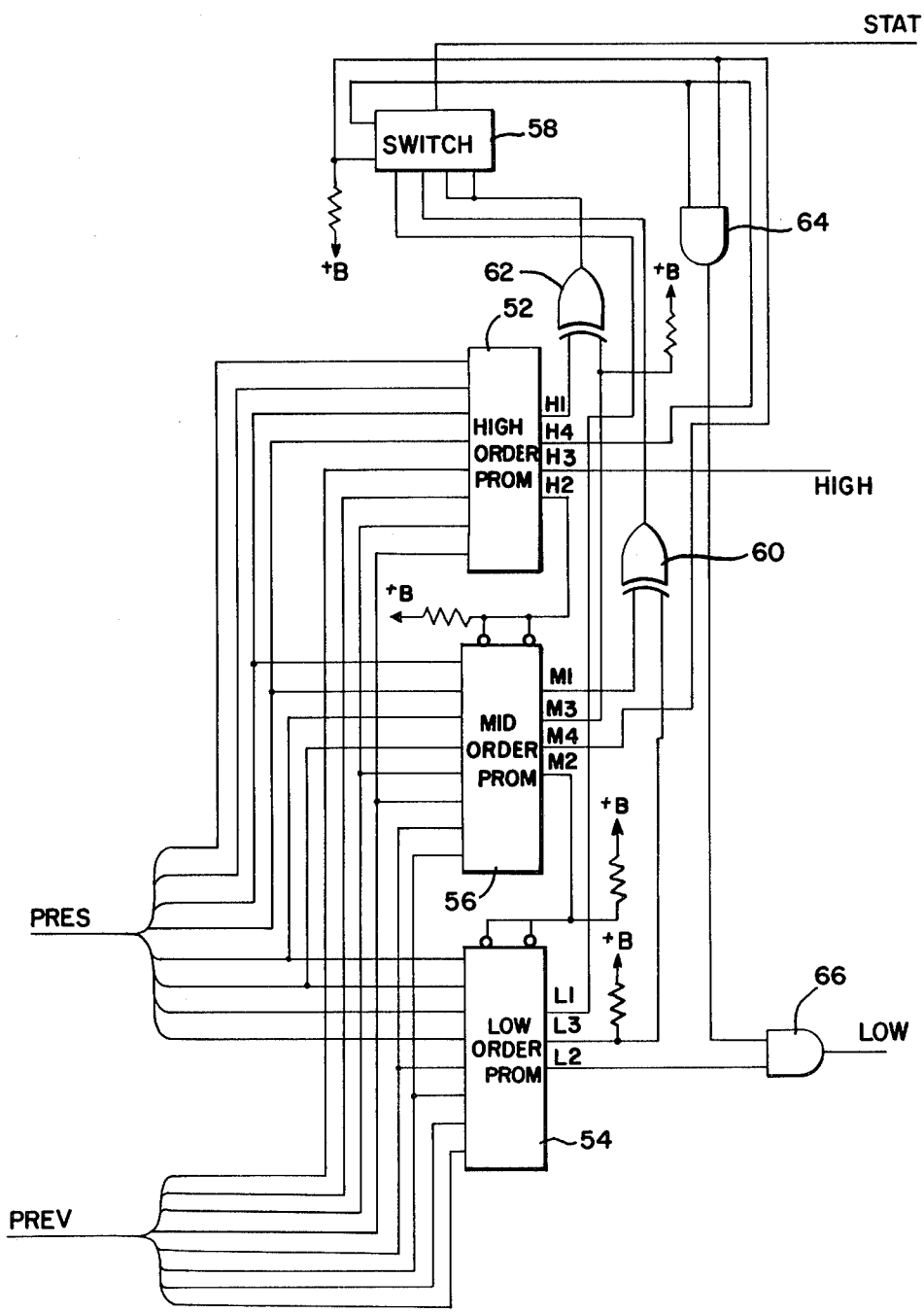
FIG. 3 is a block circuit diagram of a preferred embodiment of the comparator illustrated in block form in FIG. 2b.

The comparator illustrated in FIG. 3 includes a memory section comprised of three memory units, preferably programmable read-only memories (PROMs), that receive the PRES and PREV signals as input signals. One of the memory units, a high-order PROM 52, receives input information relating to the four most significant bits in each of the PRES and PREV signals. Another one of the memory units, a low-order PROM 54, receives the other four bits of information, i.e. the least significant bits of each of the two input signals. The third memory unit, a mid-order PROM 56, receives the four bits of each input signal having a middle value of significance, i.e. the third, fourth, fifth and sixth bits of each signal.

The high-order PROM provides an output signal that indicates one of three conditions dependent upon the information contained in the input signals. For example, in the situation in which PREV indicates the total count of 240 and PRES indicates a count of 128, the binary signals provided to the comparator are as shown below:

| PRES - 128 | 1 | 0 | 0 | 0 | 0 | 0 | 0 | 0 |
|---|---|---|---|---|---|---|---|---|
| PREV - 240 | 1 | 1 | 1 | 1 | 0 | 0 | 0 | 0 |

In this case the high-order PROM 52 will be comparing the signal 1000 to the signal 1111. This information is sufficient to determine that the ratio of the two numbers is closer to one half than it is to one. Thus, a binary one signal has been detected, and the high-order PROM 52 produces an output signal H1 related to this binary state. In addition, it also produces an output signal H2 to disable the mid-order PROM 56, which in turn disables the low-order PROM 54. In this example, since all of the most significant bits of the PREV signal are high, the PROM would also produce an output signal H3 to indicate that the count is too high and that a lower frequency clock signal is required.

In the situation in which the counts related to the lengths of the pulses in the binary signal are much lower, the high-order PROM 52 will not be provided with sufficient information to make a determination of the relative lengths of the two pulses. For example, if the present count is 15 and the previous count is 16, the PRES and PREV input signals will be as indicated below:

| PRES - 15 | 0 | 0 | 0 | 0 | 1 | 1 | 1 | 1 |
|-----------|---|---|---|---|---|---|---|---|
| PREV - 16 | 0 | 0 | 0 | 1 | 0 | 0 | 0 | 0 |

In this case, the high-order PROM 52 would attempt to compare a binary one signal with a binary zero signal. This is insufficient information to make an accurate determination, and so the high-order PROM 52 should relinquish control over the decision making process and enable the mid-order PROM 56 to make the decision and indicate the detected binary state. The mid-order PROM 56 is enabled by the H2 output signal from the high-order PROM 52. The relinquishing of control by the high-order PROM 52 is indicated by an output signal H4.

The mid-order PROM 56 would be comparing a binary 4 signal to a binary 3 signal and, based upon this information, would provide an indication that no significant difference is present and therefore the binary zero state has been detected. This indication is provided by the M1 output signal from the mid-order PROM 56. Since the mid-order PROM has sufficient information to make a decision, it disables the low-order PROM 54 by means of an output signal M2. However, if the mid-order PROM is also without sufficient information to make an accurate determination, it operates in a similar fashion to the high-order PROM to relinquish control over the decision making process and enable the low-order PROM 54 to provide an output signal L1 indicating the detected state of the binary signal. The low-order PROM 54 is enabled by means of an enabling signal M2 from the mid-order PROM, which also signifies that it is relinquishing control by means of an output signal M4.

The L1 output signal from the low-order PROM 54 is directly applied to one input terminal of a digital switch 58. The M1 and H1 output signals of the mid- and high-order PROMs 56 and 52, respectively, are applied to input terminals of the switch 58 by means of EXCLUSIVE-OR gates 60 and 62. When the high-order PROM 52 has sufficient information to make a decision, the switch 58 connects the output terminal of the EXCLUSIVE-OR gate 62 to its output terminal to provide the decision made by the high-order PROM as a STAT output signal. If the high-order PROM 52 does not have sufficient information to render a decision and relinquishes control, its output signal H4 causes the switch 58 to connect its output terminal to the input terminal connected to the EXCLUSIVE-OR gate 60. If the mid-order PROM 56 also relinquishes control over the decision making process, its output signal M4 causes the switch 58 to connect the STAT output terminal to the input terminal that receives the L1 output signal from the low-order PROM 54.

The H4 and M4 signals from the high- and mid-order PROMs 52 and 56 are also provided to the input terminals of an AND gate 64. When both PROMs relinquish control over the decision making process, the AND gate 64 is enabled and provides an input signal to a second AND gate 66. The AND gate 66 also receives an output signal L2 from the low order PROM 54 that indicates when the counts provided to that PROM are low and a switching to a high frequency clock signal is required. In response to these two enabling signals, the AND gate 66 provides the LOW output signal that is fed to the flip-flops 40 and 42.

The H1, M1 and L1 output signals from the PROMs 52, 54 and 56 are indicative of the binary state of the MAST or SLAV input signal, depending on whether the ratio of the two numbers to be compared is less than or greater than a threshold value. As discussed previously, the preferred value that is used in the context of the present invention is 0.7. When the ratio of the numbers being provided to the PROMs for comparison is relatively close to 0.5 or 1.0, the determination by a single PROM that the ratio is less than or greater than the threshold value is highly reliable. However, when the ratio of the two counts is quite close to the threshold value, the reliability of the indication of whether the binary information in the bit cell of the signal is a zero or a one decreases. This consideration becomes particularly significant when the counts provided to the PROMs are relatively low.

For example, consider the two situations in which the ratios to be detected are 112:172 and 124:160. The input signals provided to the PROMs will be as indicated below:

| PRES - 112 | 0 | 1 | 1 | 1 | 0 | 0 | 0 | 0 |
|------------|---|---|---|---|---|---|---|---|
| PREV - 172 | 1 | 0 | 1 | 0 | 1 | 1 | 0 | 0 |
| PRES - 124 | 0 | 1 | 1 | 1 | 1 | 1 | 0 | 0 |
| PREV - 160 | 1 | 0 | 1 | 0 | 0 | 0 | 0 | 0 |

The input signals provided to the high-order PROM will be the same in both cases. In other words, the four most significant bits of each number, that are provided to the high-order PROM, will be in the ratio 7:10, which lies exactly at the threshold value. Assuming that this value must be exceeded in order to indicate a binary zero level, the high-order PROM will provide an output signal indicating that a binary one state has been detected. However, this output signal will only be correct in the first case, wherein the ratio 112:172 is equal to approximately 0.65. For the second case, the ratio 124:160 is equal to approximately 0.77, and hence a binary zero level should be indicated. Consequently, it is desirable to be able to look at the next two digits in the PRES and PREV signals to determine the binary state of the input signal. In other words, it would be helpful to obtain information from the next lower order PROM to aid in a determination of whether the indication of the binary state provided by the high-order PROM 52 is correct or should be modified.

Upon analysis of those situations in which it is desirable to obtain modification information from the mid-order PROM, it has been discovered that the two pairs of input signals that are common to both the high- and mid-order PROMs, i.e. the fifth and sixth bits in the sequence, are unique for each situation. For example, in the situation depicted in the preceding example, these two pairs of bits are 11,10 for the PRES and PREV signals, respectively. In another situation of this type, for example where the ratio presented to the high-order PROM is 6:9, the two pairs of bits are 10,01. Each situation in which it is desirable to obtain aid, or modification information, from the mid-order PROM has a unique address in that PROM. Thus for each situation it is possible for the mid-order PROM to provide a unique signal indicative of whether the H1 output signal from the high-order PROM is correct or should be modified on the basis of the other two pairs of bits presented to it. In other words, the third and fourth bits in each input signal determine whether the indication from the high-order PROM is correct.

A modification signal M3 from the mid-order PROM 56 is provided to the other input terminal of the EXCLUSIVE-OR gate 62. This input terminal is normally biased to the high state, so that the output signal of the EXCLUSIVE-OR gate 62 is normally the complement of the H1 signal stored in the high-order PROM. Accordingly the H1 signal from the high-order PROM should be the complement of the actual detected state of the binary signal, so that when it is inverted in the EXCLUSIVE-OR gate 62 it is presented as the appropriate signal to the switch 58. However, if the mid-order PROM modification signal M3 indicates that the decision made by the high-order PROM 52 is incorrect, for example as explained above in the case where the ratio of the signals is 124:160, the M3 signal will be low and the EXCLUSIVE-OR gate 62 will not invert the output signal H1 from the high-order PROM 52. Thus, the signal that is presented to the switch 58 is the inverse of the decision indicated by the high-order PROM 52.

Thus it will be apparent that there are three types of conditions that the high-order PROM is capable of indicating. The first of these is that the most significant bits of the PRES and PREV signals provide sufficient information to make a decision as to the binary information contained in the measured bit cell of the binary input signal, and an indication of this information is provided. In this situation, both the mid- and low-order PROMs are disabled and have no influence upon the decision making process. In the second case, the high-order PROM does not receive sufficient information to render a decision and therefore relinquishes control over the decision making process and enables the mid-order PROM 56. In the third case, the high-order PROM has enough information to make a probable decision about the binary state of the input signal, but such decision is not totally reliable. In this case, the high-order PROM does not relinquish control over the decision making process, but it does enable the mid-order PROM to provide an output signal. This output signal from the mid-order PROM is capable of modifying that of the high-order PROM so that the appropriate signal is provided to the switch 58.

The same relationship exists between the mid-order PROM 56 and the low-order PROM 54, so that the low-order PROM provides an output signal L3 to the EXCLUSIVE-OR gate 60 whenever the mid-order PROM provides a probable output decision that may require modification.

Reference is made to co-pending application Ser. No. 364,923 entitled "Ratio Comparator for Digital Signals" for further detailed information regarding the makeup and theory of operation of the comparator illustrated in FIG. 3. The disclosure of that application is intended to be incorporated herein by reference thereto.

From the foregoing, it will be appreciated that the present invention provides a reliable and accurate method and system for decoding the binary information in a digital signal. The decoding of the information is independent of the speed at which the binary signal is read, so that variations in the length of the bit cells of the signal do not have an adverse affect upon the decoding process. The invention is particularly useful in the decoding of time code signals that are recorded on magnetic storage tape.

The illustrated embodiment discloses the decoding of two time code signals with the use of two pulse length determining circuits whose output signals are multiplexed to the comparator. However, it will be appreciated that a larger number of signals can be decoded with one system of the type disclosed herein. It is only necessary to add a pulse length determining circuit for each separate signal to be decoded. The number of signals that can be decoded is practically limited only by the processing time of the comparator circuit. For example, the average processing time of the comparator illustrated in FIG. 3 might be in the neighborhood of 100 nsec. It has been determined that up to eight different time code signals can be reliably decoded in a single decoding circuit with such processing time. Therefore, it is possible to slave up to seven different recorders to one master recorder with a single decoding circuit. If the processing time of the comparator is reduced further, the number of signals that can be decoded can be correspondingly increased.

Furthermore, the invention is not limited to the decoding of a signal of the type illustrated in FIG. 1a. For example, if the binary information is conveyed by the location of a transition within a bit cell, rather than its presence or absence, the threshold value of the comparator can be established to distinguish between different locations.

Alternatively, the comparator can be set up to detect two or more threshold values. For example, in the previously noted Miller code described in U.S. Pat. No. 3,108,261, the length of a bit cell is the length of the shortest pulse in the signal, rather than the longest one as in a Manchester type of code. Other pulses in the signal can have a length of 1½ or 2 times that of the bit cell. The comparator can be set up to detect either of these other two situations, as well as pulses that are of the same length as a bit cell. In addition, the timing circuit can disable the transfer of pulse length information to the memory unit except when a pulse is detected that is approximately the same length as that previously determined for a bit cell, to thereby update the bit cell information.

Thus it will be appreciated that the present invention can be embodied in other specific forms without departing from the spirit or essential characteristics thereof. The presently disclosed embodiment is therefore considered in all respects to be illustrative and not restrictive. The scope of the invention is indicated by the appended claims rather than the foregoing description, and all changes that come within the meaning and range of equivalency of the claims are therefore intended to be embraced therein.

What is claimed is:

1. Apparatus for decoding a binary signal that comprises a series of bit cells, each of which contains one bit of binary information, comprising:
   means for detecting transitions in the binary signal;
   means responsive to said transition detector for determining the length of a pulse between two successive transitions;
   a memory unit for storing the total length of the bit cell immediately preceding said pulse;
   means for comparing the determined pulse length with the stored bit cell length and for providing an indication relating to whether there is a significant difference in the length of said pulse relative to that of said bit cell; and means responsive to the indication from said comparing means for providing an output signal related to the binary state said pulse represents.

2. The apparatus of claim 1 wherein said comparing means includes means for indicating whether the ratio of the two compared lengths exceeds a predetermined threshold value.

3. The apparatus of claim 2 wherein said threshold value is approximately 0.7.

4. The apparatus of claim 1 wherein said determining means includes a timing device for producing clock pulses and a counter responsive to said transition detector for counting the number of clock pulses that are produced by said timing device between a pair of successive transitions.

5. The apparatus of claim 4 wherein said timing device includes two clock pulse sources for producing clock pulses at two different frequencies, respectively, and a switching device responsive to the number of clock pulses counted by said counter for selectively enabling the clock pulses from one of said sources to be supplied to said counter.

6. The apparatus of claim 4 wherein said counter is normally reset in response to the detection of each transition in the binary signal, and wherein said transition detector is inhibited from providing an output signal indicating the detection of the next transition to thereby prevent the resetting of said counter when said output signal providing means indicates that said one binary state has been detected, whereby said counter determines the total length of two successive pulses.

7. The apparatus of claim 1 wherein said comparing means includes:

a high-order memory unit for receiving input information relating to the most significant data concerning each of the pulse lengths to be compared and providing an output signal that signifies one of (a) a definite indication whether a significant difference is present, (b) a probable indication of whether a significant difference is present, and (c) a lack of sufficient data to determine whether a significant difference is present;

a mid-order memory unit for receiving input information relating to data containing some of the most significant data and some of the least significant data concerning each of the two lengths to be compared and, in response to a signal from said high-order memory unit signifying either of conditions (b) or (c), providing an output signal that signifies one of (d) a definite indication of whether a significant difference is present, (e) a probable indication of whether a significant difference is present, and (f) a lack of sufficient data to determine whether a significant difference is present, and a signal indicating the validity of a probable indication from said high-order memory unit;

a low-order memory unit for receiving input information relating to the least significant data concerning each of the two lengths to be compared and, in response to a signal from said mid-order memory unit signifying either of conditions (e) and (f), providing an output signal that signifies whether a significant difference is present and a signal indicating the validity of a probable indication from said mid-order memory unit; and switching means responsive to the output signals from each of said memory units for transmitting to said output signal providing means an indication relating to whether a significant difference has been detected.

8. The apparatus of claim 7 wherein said determining means includes a timing device capable of selectively producing clock pulses at two different frequencies, and wherein said low-order memory unit also provides a control signal to cause said timing device to switch from the lower frequency clock pulses to the higher frequency clock pulses in response to predetermined input information.

9. The apparatus of claim 8 wherein said high-order memory unit also provides a control signal to cause said timing device to switch from the higher frequency clock pulses to the lower frequency clock pulses in response to predetermined input information.

10. The apparatus of claim 7 wherein said switching means includes a logic circuit for modifying a probable indication signal from said high-order memory unit in response to an invalid indication from said mid-order memory unit, and for modifying a probable indication signal from said mid-order memory unit in response to an invalid indication from said low-order memory unit.

11. The apparatus of claim 1 wherein the binary signal is encoded in a Manchester type format.

12. The apparatus of claim 1 wherein the indication from said comparing means is independent of the rate at which transitions are detected in the binary signal.

13. The apparatus of claim 1 wherein the bit cell length stored in said memory unit selectively comprises a value relating to one or two preceding pulse length determinations.

14. A multiplexed decoder for decoding at least two binary signals, comprising:

first and second means for determining the length of each pulse in said two binary signals, respectively;

first and second memory units, respectively associated with said first and second length determining means, for storing a previously determined length value related to at least one pulse while the length of a succeeding pulse is being determined;

means for comparing two values and providing an indication whether there is a significant difference between the two values;

means for selectively connecting one of said pulse length determining means and its associated memory unit to said comparing means to provide input information thereto relating to two different length determinations for one of the binary signals; and means responsive to the indication from said comparing means for providing an output signal related to the binary state of said one binary signal.

15. The apparatus of claim 14 wherein said comparing means includes means for indicating whether the ratio of the two compared values exceeds a predetermined threshold value.

16. The apparatus of claim 15 wherein said threshold value is approximately 0.7.

17. The apparatus of claim 14 wherein said connecting means is responsive to the detection of a transition in one of said binary signals to selectively enable the pulse length determining means and memory unit associated with that signal to provide output signals to said comparing means.

18. The apparatus of claim 17 wherein said connecting means also inhibits the output of information from the pulse length determining means and the memory unit associated with the other signal.

19. The apparatus of claim 14 wherein said output signal providing means includes first and second memory devices respectively associated with said two binary signals, each memory device selectively receiving the indication from said comparing means upon detection of a transition in the binary signal with which it is associated.

20. The apparatus of claim 14 wherein each of said pulse length determining means includes a counter for counting clock pulses during each pulse in one of the binary signals, and further including two clock pulse sources for producing clock pulses at two different frequencies, respectively, and a switching device responsive to the contents of a counter for selectively applying one of the clock pulse signals to said counter.

21. The apparatus of claim 20 wherein said counter is normally reset in response to the detection of each transition in said one binary signal, and further including means for inhibiting said counter from being reset upon the detection of a transition in said binary signal when a predetermined binary state is detected, so that said counter determines to the total length of two successive pulses in said binary signal.

22. The apparatus of claim 14 wherein the value stored in each of said memory units is the determined length of one pulse in the binary signal associated with said memory unit when one binary state is detected in the binary signal, and is the total length of two successive pulses in the binary signal when the other binary state is detected in the binary signal.

23. The apparatus of claim 14 wherein the value stored in each of said memory units is the total length of the bit cell immediately preceding a pulse whose length is being determined in the associated length determining means.

24. A method for decoding a binary signal comprising the steps of:

establishing the length of a bit cell in the binary signal;

determining the length of the next successive pulse in the binary signal;

comparing the determined pulse length to the established bit cell length;

indicating whether the ratio of the two compared lengths exceeds a predetermined threshold value;

providing an indication that the binary signal represents one or the other binary state in response to whether or not the ratio is greater than said threshold value; and updating the established bit cell length in accordance with the determined length of at least said pulse.

25. The method of claim 24 wherein the updated bit cell length is equal to the determined pulse length when one binary state is indicated and equal to the sum of the lengths of two successive pulses in the binary signal when the other binary state is indicated.

26. The method of claim 24 wherein said predetermined threshold value is 0.7.

27. The method of claim 24 wherein the step of determining the length of each pulse includes detecting two successive transitions in the binary signal, generating a clock signal, and counting the number of clock pulses appearing between the two detected transitions.

28. The method of claim 27 further including the step of changing the frequency of said clock signal when the counted number of clock pulses lies outside a predetermined range.

29. The method of claim 24 or 25 further including the step of selectively inhibiting the determination of the length of a pulse when one of said binary states is indicated.

30. The method of claim 24 wherein the binary signal is encoded in a Manchester type format.

31. The method of claim 24 wherein said indication is independent of the speed at which the binary signal is read.

32. A method for decoding a binary signal comprising the steps of:

establishing the length of a bit cell in the binary signal;

determining the length of a succeeding pulse in the binary signal;

comparing the determined pulse length to the established bit cell length;

indicating the ratio of the two compared lengths relative to a threshold value;

indicating the binary state of the binary signal in dependence upon the indicated ratio; and selectively updating the established bit cell length to be the determined pulse length in response to the indicated ratio.

* * * * *